(12) United States Patent
Mizumura et al.

(10) Patent No.: US 9,304,391 B2
(45) Date of Patent: Apr. 5, 2016

(54) EXPOSURE APPARATUS USING MICROLENS ARRAY AND OPTICAL MEMBER

(75) Inventors: Michinobu Mizumura, Yokohama (JP); Toshinari Arai, Yokohama (JP)

(73) Assignee: V TECHNOLOGY CO., LTD., Yokohama-shi, Kanagawa (JP)

( * ) Notice: Subject to any disclaimer, the term of this patent is extended or adjusted under 35 U.S.C. 154(b) by 495 days.

(21) Appl. No.: 13/814,222

(22) PCT Filed: Jul. 26, 2011

(86) PCT No.: PCT/JP2011/066994
§ 371 (c)(1),
(2), (4) Date: Feb. 4, 2013

(87) PCT Pub. No.: WO2012/029449
PCT Pub. Date: Mar. 8, 2012

(65) Prior Publication Data
US 2013/0128253 A1    May 23, 2013

(30) Foreign Application Priority Data
Aug. 30, 2010  (JP) .................................. 2010-192861

(51) Int. Cl.
*G03F 7/20* (2006.01)
*G03F 1/42* (2012.01)
(Continued)

(52) U.S. Cl.
CPC ................ *G03F 1/42* (2013.01); *G02B 3/0056* (2013.01); *G02B 3/0068* (2013.01); *G03F 1/38* (2013.01); *G03F 9/7038* (2013.01); *G03F 9/7096* (2013.01)

(58) Field of Classification Search
CPC ...... G02B 3/0056; G02B 3/0068; G03F 1/38; G03F 1/42; G03F 9/7038; G03F 9/7096; G03F 9/7073; G03F 9/7088; G03F 9/7076; G03F 9/70; G03F 9/7003; G03F 7/70716; G03F 9/7015
USPC .................................................. 356/399, 401
See application file for complete search history.

(56) References Cited

U.S. PATENT DOCUMENTS 6,016,185 A * 1/2000 Cullman et al. ................. 355/52
6,023,313 A * 2/2000 Hazama .......................... 349/95
(Continued)

FOREIGN PATENT DOCUMENTS

JP        08-08164 A      1/1996
JP     2009-277900 A     11/2009
(Continued)

OTHER PUBLICATIONS

International Search Report in PCT/JP2011/066994 dated Aug. 30, 2011(English Translation Thereof).
(Continued)

*Primary Examiner* — Steven H Whitesell Gordon
(74) *Attorney, Agent, or Firm* — McGinn IP Law Group PLLC

(57) ABSTRACT

An exposure apparatus and an optical member wherein impurities can be prevented from infiltrating between microlens arrays and a substrate, and microlenses can be prevented from being scratched by the impurities and by getting abnormally close to the substrate. Microlens arrays in which pluralities of microlenses are formed are arranged above a transparent substrate, and the microlens arrays are bonded and the end surfaces to a mask. Alignment mark supports are bonded to the mask at both sides of the microlens arrays, and alignment marks are formed in the surfaces of the alignment mark supports that face the substrate. The spaces between the alignment mark supports and the substrate are smaller than the spaces between the microlens arrays and the substrate.

7 Claims, 3 Drawing Sheets

(51) Int. Cl.
*G03F 1/38* (2012.01)
*G03F 9/00* (2006.01)
*G02B 3/00* (2006.01)

(56) References Cited

U.S. PATENT DOCUMENTS

| | | | | |
|---|---|---|---|---|
| 6,107,011 | A | * | 8/2000 | Gelbart .................. 430/397 |
| 6,204,895 | B1 | * | 3/2001 | Nakamura et al. ............. 349/5 |
| 6,381,002 | B1 | | 4/2002 | Suzuki |
| 2006/0001855 | A1 | * | 1/2006 | Lof et al. .................. 355/69 |
| 2011/0194095 | A1 | * | 8/2011 | Mizumura ................. 355/74 |
| 2011/0244379 | A1 | * | 10/2011 | Kajiyama et al. ............. 430/5 |
| 2012/0212717 | A1 | * | 8/2012 | Hatanaka .................. 355/53 |
| 2012/0218537 | A1 | * | 8/2012 | Mizumura ................. 355/53 |
| 2013/0141704 | A1 | * | 6/2013 | Mizumura ................. 355/44 |

FOREIGN PATENT DOCUMENTS

| | | |
|---|---|---|
| TW | 500973 B | 9/2002 |
| WO | WO2010/047362 A1 | 4/2010 |

OTHER PUBLICATIONS

Taiwanese Office Action dated Nov. 12, 2015 with a partial Japanese translation and a partial English translation.

* cited by examiner

Prior Art FIG. 5
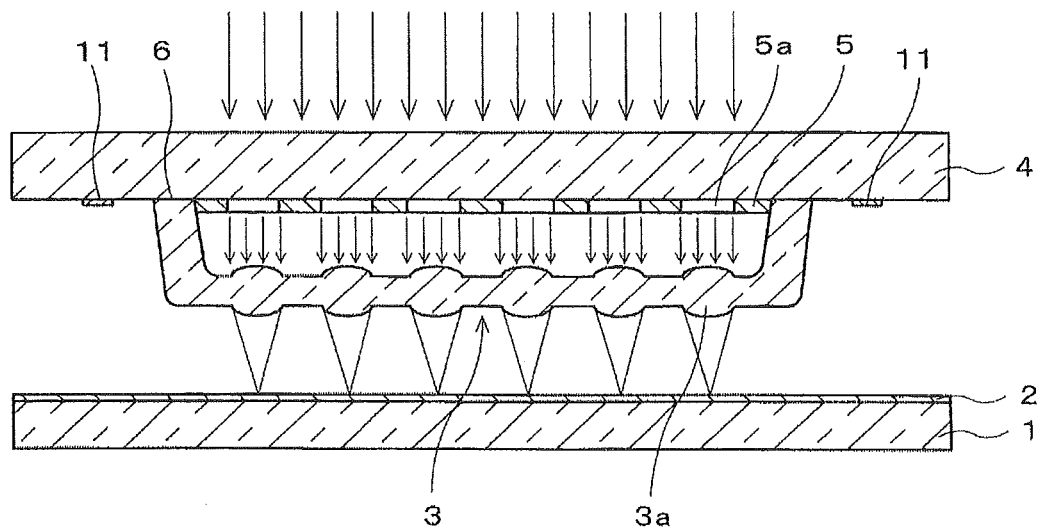
Prior Art FIG. 6
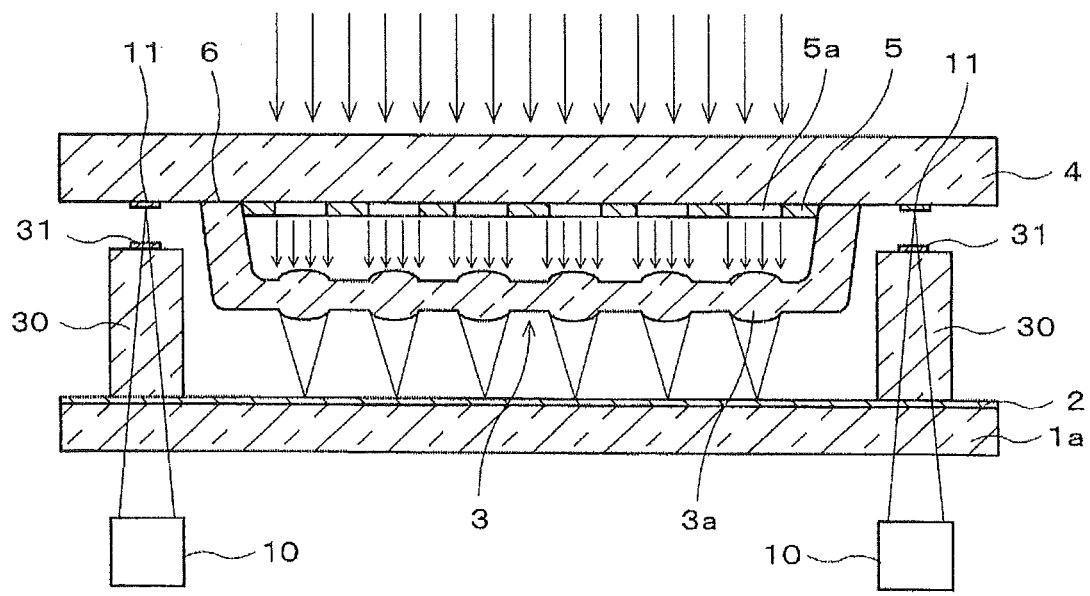

EXPOSURE APPARATUS USING MICROLENS ARRAY AND OPTICAL MEMBER

TECHNICAL FIELD

The present invention relates to an exposure apparatus using a microlens array and an optical member.

BACKGROUND ART

In conventional practice, exposure apparatuses that use microlens arrays have been used as laser annealing apparatuses for reforming an amorphous silicon film into a polysilicon film by irradiating the amorphous silicon film with laser light and melting and solidifying the amorphous silicon film by the heat of the laser light. Such exposure apparatuses have been used as exposure apparatuses for photolithography wherein a mask image is projected and exposed on a resist film, and a resist pattern is formed by a subsequent developing process. The invention disclosed in Patent Document 1 is an example of an exposure apparatus in which the microlens array is used.

In the exposure apparatus disclosed in Patent Document 1, an object 101 to be exposed is placed on a stage 100, and a photomask 102 and a microlens array 106 are arranged above the object 101 to be exposed, as shown in FIG. 4. Exposure light from a light source 111 is focused by a collimator lens 110 and radiated onto the photomask 102. The photomask 102 contains a light-blocking film 104 having openings 105, the film formed on the top surface of a transparent substrate 103; and numerous microlenses 107 arranged two-dimensionally are formed on the bottom surface of the transparent substrate 103, constituting the microlens array 106. Exposure light transmitted through the openings 105 of the light-blocking film 104 are transmitted through the microlenses 107 of the microlens array 106, made to converge, and imaged on the object 101 to be exposed. The photomask 102 and the microlens array 106 are supported by a mask stage 108.

FIG. 5 is a cross-sectional view showing a projection-exposure type exposure apparatus using a conventional microlens array. A resist film 2 is formed on a substrate 1, and the substrate 1 is conveyed below a microlens exposure apparatus. A conventional microlens exposure apparatus is provided with a microlens array 3 formed by two-dimensionally arranging numerous microlenses 3a, and a mask 4 is arranged above the microlens array 3. The microlens array 3 is formed from a transparent quartz substrate, and the microlenses 3a are machined into the transparent quartz substrate of the microlens array 3. The mask 4 is configured by bonding a Cr film 5 to the bottom surface of the transparent substrate of the same material as the microlens array 3, and holes 5a through which laser light passes are formed in the Cr film 5. Portions of the mask 4 other than the holes 5a are covered by the Cr film 5, constituting light-blocking portions that prevent laser light from passing through. Both ends of the microlens array 3 are bent so as to extend towards the mask 4, and the end surfaces of these ends are bonded to the mask 4 above. The mask 4 and the microlens array 3 are thereby fixed in place.

In a conventional microlens exposure apparatus configured in this manner, when the laser light for exposure is radiated onto the mask 4, the laser light that has passed through the holes 5a in the mask 4 is irradiated onto the microlenses 3a of the microlens array 3 and the microlenses 3a cause the light to converge on the resist film 2 on the substrate 1. A pattern to be projected is formed in the holes 5a, and when the laser light is transmitted through the holes 5a and radiated onto the resist film 2, the pattern is projected onto the resist film 2.

In the conventional projection-exposure type exposure apparatus using a microlens array, positional alignment of the substrate 1 with the mask 4 and the microlens arrays 3 has been performed using a substrate 1a for adjustment shown in FIG. 6. Alignment marks 11 are formed at both ends in the bottom surface of the mask 4 where there are no microlens arrays 3, and cameras 10 are arranged below the alignment marks 11 and also below the transparent substrate 1a for adjustment. Transparent supports 30 are provided on the substrate 1a for adjustment at positions facing the alignment marks 11, and marks 31 are formed on these transparent supports 30. The mask 4 and the microlens arrays 3 are positioned relative to the substrate 1a for adjustment so that the alignment marks 11 on the bottom surface of the mask 4 and the marks 31 on the supports 30 coincide within the same field of vision as seen through the cameras 10. Thus, in the substrate 1a for adjustment, positional adjustment between the production substrate 1 and the mask 4 is performed by aligning the positions of the mask 4 and the substrate 1a.

PRIOR ART DOCUMENTS

Patent Documents

Patent Document 1: JP-A-2009-277900

DISCLOSURE OF THE INVENTION

Problems the Invention is Intended to Solve

In either of the conventional exposure apparatuses described above, since the microlens arrays 3 are bonded to the mask 4, the microlens surfaces of the microlens arrays 3 are the nearest to the surface of the substrate 1. Therefore, when there is an abnormality in managing the gaps, the microlens surfaces first come in contact with the substrate surface, and the possibility of the microlenses being scratched is therefore extremely high. The distance between the microlens arrays 3 and the substrate 1 (the resist film 2 in actuality) is approximately 200 μm. Thus, because the space between the microlens arrays 3 and the substrate 1 is small, when the substrate 1 is exposed to light by the microlens arrays 3, there is a risk of the microlens arrays 3 being scraped by impurities when impurities are present on the substrate 1. The microlens arrays 3 are extremely costly components of a microlens array exposure apparatus, and there is no method of dealing with scrapes on the microlens arrays 3 other than replacing them with new microlens arrays. Consequently, there has been an urgent need to find a countermeasure for preventing impurities from getting in between the substrate 1 and the microlens arrays 3. However, the infiltration of impurities between the substrate 1 and the microlens arrays 3 cannot be prevented in conventional exposure apparatuses. Conventionally, a substrate 1a for adjustment has been used to align the positions of the mask 4 and the substrate 1a for adjustment and thereby indirectly align the position of the production substrate 1, and this operation has been complicated.

The present invention was devised in view of these problems, it being an object thereof to provide an exposure apparatus using a microlens array and an optical member, wherein impurities can be prevented from getting in between the microlens arrays and a substrate, and the microlenses can be prevented from being scratched by the impurities and by getting abnormally close to the substrate.

Means for Solving the Problems

An exposure apparatus using a microlens array according to the present invention comprises a substrate stage for supporting a transparent substrate to be subjected to exposure, a microlens array arranged above the substrate stage and having a plurality of microlenses formed therein, a light-blocking mask arranged above the microlens array and fixed to the microlens array, an exposure light source, an optical device for guiding outgoing exposure light from the exposure light source to the light-blocking mask and using the microlens array to image exposure light transmitted through the light-blocking mask onto a substrate on the substrate stage, an alignment mark support arranged in the surface of the mask that faces the substrate, an alignment mark formed in the surface of the alignment mark support that faces the substrate, and mark detection means for radiating light transmitted through the transparent substrate onto the alignment mark and detecting a substrate mark provided to the transparent substrate and the alignment mark within the same field of vision, the mark detection means being arranged below the transparent substrate; wherein the space between the alignment mark support and the substrate is smaller than the space between the microlenses and the substrate.

This exposure apparatus can be configured such that a concave part or a step is formed in the surface of the alignment mark support that faces the substrate, and the alignment mark is formed in a low position in the concave part or step.

Furthermore, for example, the microlens array and the transparent substrate are capable of moving relative to each other, and a pair of the alignment marks are formed at both ends of the mask in a direction orthogonal to the movement direction.

An optical member according to the present invention comprises a microlens array for imaging exposure light on a substrate to be subjected to exposure and exposing the substrate, a light-blocking mask fixed to the microlens array so as to be parallel to the microlens array, an alignment mark support arranged farther outside than the microlens array in the surface of the mask on the side where the microlens array is arranged, and an alignment mark formed in the distal end surface of the alignment mark support; wherein the distance between the distal end surface of the alignment mark support and the mask is greater than the distance between the distal end surface of the microlens array and the mask.

This optical member can be configured such that a concave part or a step is formed in the distal end surface of the alignment mark support, and the alignment mark is formed in a low position in the concave part or step.

Effects of the Invention

According to the present invention, because the alignment mark support is nearest to the substrate, even when there is an abnormality in managing the gaps or when impurities are present on the substrate, it is the alignment mark support and not the microlens array with which the substrate or impurities come into contact. Therefore, the microlens array is prevented from being scratched by contact with the substrate or the impurities. In the present invention, there is no need to use a substrate for adjustment to align the positions of the mask and the substrate, and positional alignment can be performed during the exposure process on a production substrate.

BRIEF DESCRIPTION OF THE DRAWINGS

FIG. 5 is a cross-sectional view showing another conventional exposure apparatus; and FIG. 6 is a cross-sectional view showing a conventional positional alignment method.

BEST MODE FOR CARRYING OUT THE INVENTION

Figure 1:
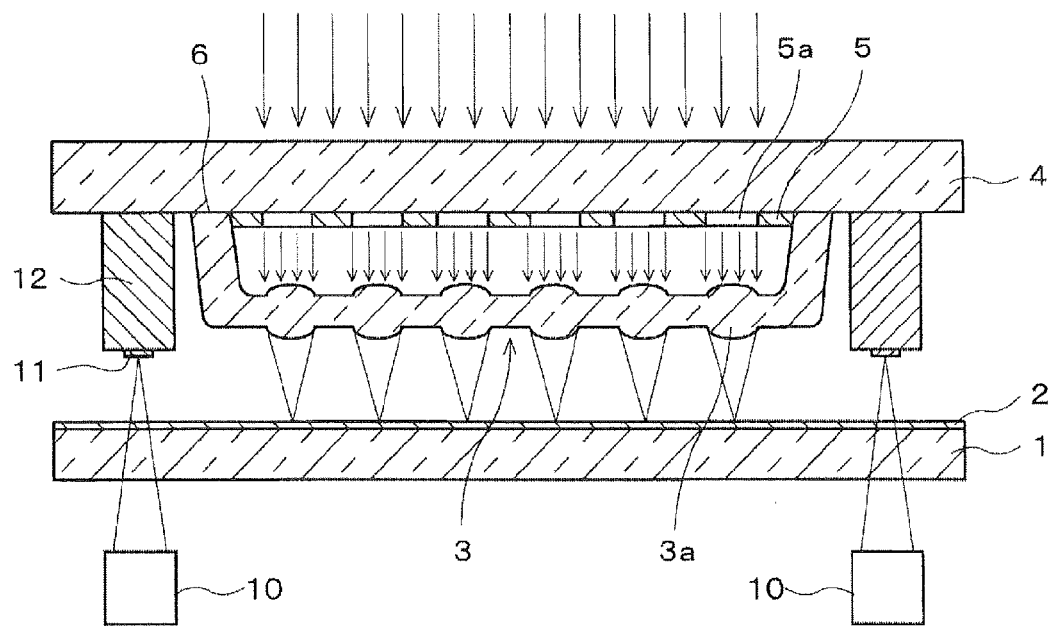
FIG. 1 is a cross-sectional view showing an exposure apparatus according to an embodiment of the present invention.

Embodiments of the present invention will be described in detail hereinbelow with reference to the attached drawings. FIG. 1 is a longitudinal cross-sectional view showing an exposure apparatus using microlens arrays according to the first embodiment of the present invention. A transparent substrate 1 is conveyed onto a suitable substrate stage (not shown) and supported on this substrate stage. A resist film 2 for photolithography, for example is formed on the transparent substrate 1, and exposure light is radiated from the microlens exposure apparatus of the present embodiment onto the resist film 2. Provided above the substrate stage (the substrate 1) are microlens arrays 3 in which numerous microlenses 3a are arranged and formed two-dimensionally, and a mask 4 is arranged above the microlens arrays 3. The microlens arrays 3 are formed from a transparent quartz substrate, for example, and the microlenses 3a are machined into the transparent quartz substrates of the microlens arrays 3. The light-blocking mask 4 is configured with a Cr (chromium) film 5 bonded to the bottom surface of a transparent substrate of the same material as the microlens arrays 3, and holes 5a for the passage of laser light are formed in this Cr film 5. The Cr film 5 having the holes 5a is arranged in the widthwise center of the mask 4.

Both ends of each of the microlens arrays 3 are bent upward toward the mask 4, and the end surfaces 6 of these ends are bonded to the mask 4 above. The microlens arrays 3 and the mask 4 are thereby fixed in place.

Exposure light incident on the mask 4 from a suitable light source (not shown) is transmitted through the holes 5a in the Cr film 5 of the mask 4 to be incident on the microlens arrays 3, and is projected by the microlens arrays 3 onto the resist film 2 on the substrate 1. The microlens arrays 3 image patterns of the holes 5a of the mask 4 on the resist film 2 on the substrate 1 as equal-magnification erected images.

Alignment mark supports 12 are bonded to both ends of the bottom surface of the mask 4 where there are no microlens arrays 3, and cross-shaped alignment marks 11, for example, are formed in the surfaces of the alignment mark supports 12 that face the substrate 1. Cameras 10 are arranged below the alignment marks 11 and also below the transparent substrate 1. Alignment mark windows are formed in the substrate 1, the alignment marks 11 are observed through the alignment mark windows from the cameras 10, and the marks are photographed. The mask 4 and the microlens arrays 3 are positioned relative to the substrate 1 so that the substrate marks formed in the alignment windows on the surface of the transparent substrate 1 and the alignment marks 11 formed in the bottom surfaces of the alignment mark supports 12 thereby coincide in the same field of vision in the images photographed by the cameras 10.

The height of the alignment mark supports 12 is decided so that the alignment marks 11 are positioned nearer to the substrate 1 than the microlens arrays 3. Specifically, the spaces between the substrate 1 and the alignment marks 11 or alignment mark supports 12 are smaller than the space between the microlens arrays 3 and the substrate 1.

Figure 3:
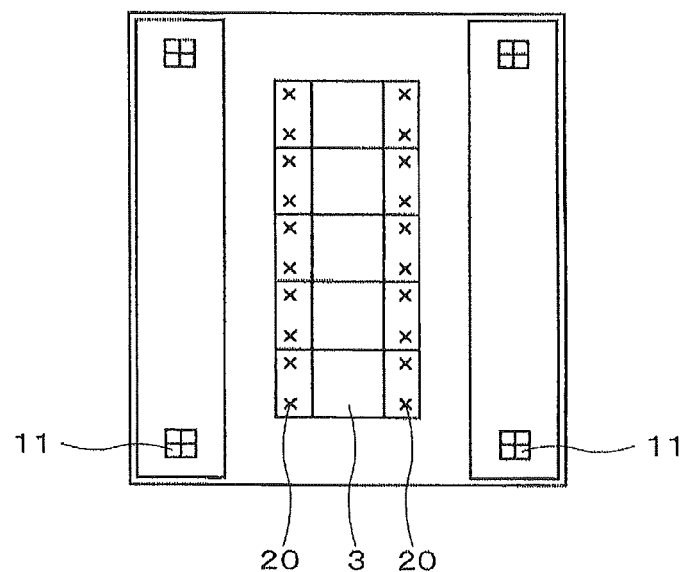
FIG. 3 is a drawing showing the bottom surface of a mask.
Figure 4:
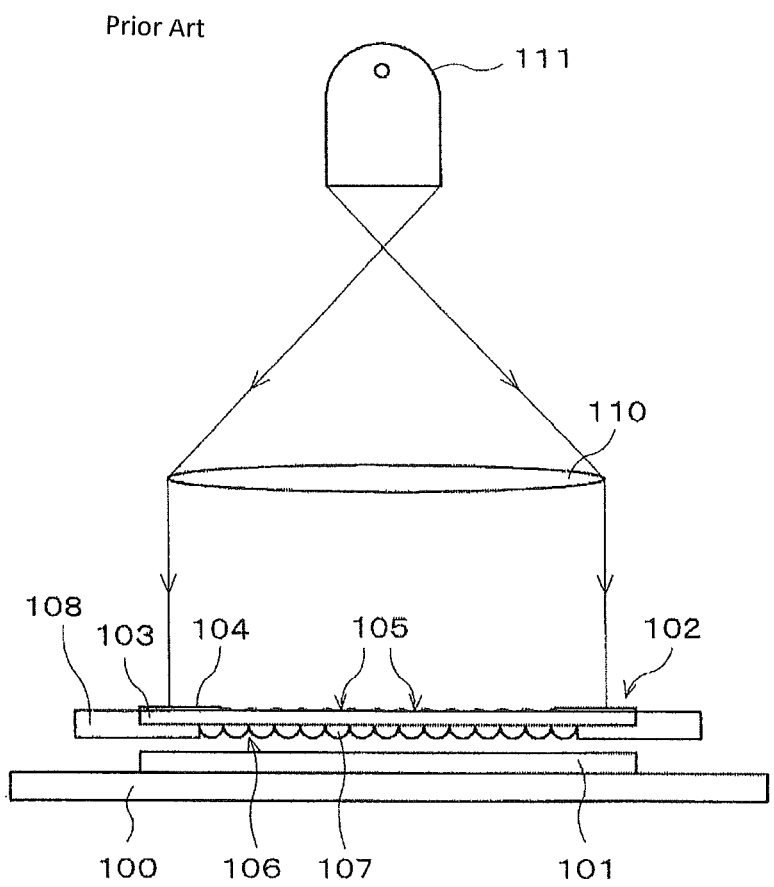
FIG. 4 is a drawing showing a conventional exposure apparatus.

Two pairs of alignment marks 11 are provided to both sides of each of the microlens arrays 3 as shown in FIG. 3.

A plurality of microlens arrays 3 are arranged in a direction perpendicular to the scanning direction of the substrate 1. In the direction perpendicular to the scanning direction of the substrate 1, the exposure areas of the substrate 1 are exposed simultaneously, and in the scanning direction of the substrate 1, either the areas are exposed continuously during the scanning process, or scanning is briefly stopped and the areas are exposed intermittently. The marks 20 are marks during manufacturing of the mask.

In the microlens exposure apparatus of the present embodiment configured in this manner, when laser light for exposure is radiated onto the mask 4, the exposure light transmitted through the holes 5a of the mask 4 are incident on the microlenses 3a of the microlens arrays 3 and made by the microlenses 3a to converge on the resist film 2 on the substrate 1. The patterns to be projected are formed in the holes 5a, and when the laser light is transmitted through the holes 5a and radiated onto the resist film 2, the patterns are projected as erected equal-magnification images onto the resist film 2. In this case, the gaps between the microlens arrays 3 and the substrate 1 are controlled so as to be a predetermined value (200 μm, for example), in order for the exposure light to be imaged on the resist film 2. The positions of the microlens arrays 3 and the mask 4 relative to the substrate 1 are decided so that the alignment marks 11 are photographed through the alignment windows of the substrate 1 by the cameras 10 arranged below the substrate 1, and the substrate marks provided in the alignment windows of the substrate 1 and the alignment marks 11 on the alignment mark supports 12 coincide in the same field of vision.

When managing the gaps between the microlens arrays 3 and the substrate 1 becomes abnormal, there is a possibility that the microlens arrays 3 will become abnormally close to the substrate 1. When the gaps thus become abnormally short, in the present embodiment, the alignment mark supports 12 first come in contact with the substrate 1. Therefore, the microlens arrays 3 come in contact with the substrate 1 and the microlens arrays 3 are not scratched. During exposure, the substrate 1 and the exposure light source are scanned, and when the substrate 1 and the exposure light source have moved relative to the microlens arrays 3 and the mask 4, there is a possibility of impurities getting on the substrate 1. When impurities have gotten on the substrate during this exposure, the impurities are covered by the alignment mark supports 12 and prevented from getting in between the microlens arrays 3 and the substrate 1. Therefore, the microlens arrays 3 are not scratched even if impurities get on the substrate 1 during exposure.

Thus, the microlens arrays 3 are prevented from being scratched. There is a possibility, however, of the alignment marks 11 being scratched when the gap is abnormal or when there are impurities. However, because the process of aligning the substrate that uses the alignment marks 11 and the microlens arrays 3 and mask 4 is performed before exposure, the above-described abnormalities occurring and scratching the alignment marks 11 during exposure does not cause any hindrances. When the alignment marks 11 have thus been scratched, the microlens arrays 3 are peeled away from the transparent substrate of the mask 4 at the end surfaces 6 and the microlens arrays 3 are bonded to another mask 4, whereby the microlens arrays 3 can be reused. Consequently, the costly microlens arrays 3 can be used effectively to reduce the running cost of exposure.

In the present embodiment, because the alignment marks 11 are provided to the substrate-facing surfaces of the alignment mark supports 12, the alignment marks 11 are kept close to the substrate 1 and the distance between the alignment marks 11 and substrate 1 is kept within the depth of focus of the cameras 10, the alignment marks on the substrate 1 and the alignment marks 11 can therefore be photographed in the same field of vision by the cameras 10 provided underneath the substrate 1, and the positions of the substrate 1 and the microlens arrays 3 and mask 4 can be aligned. In the present embodiment, the positions of the mask 4 and microlens arrays 3 and the substrate 1 can be aligned on production substrates undergoing the exposure process, and there is no need to align the positions using substrates for adjustment.

Figure 2:
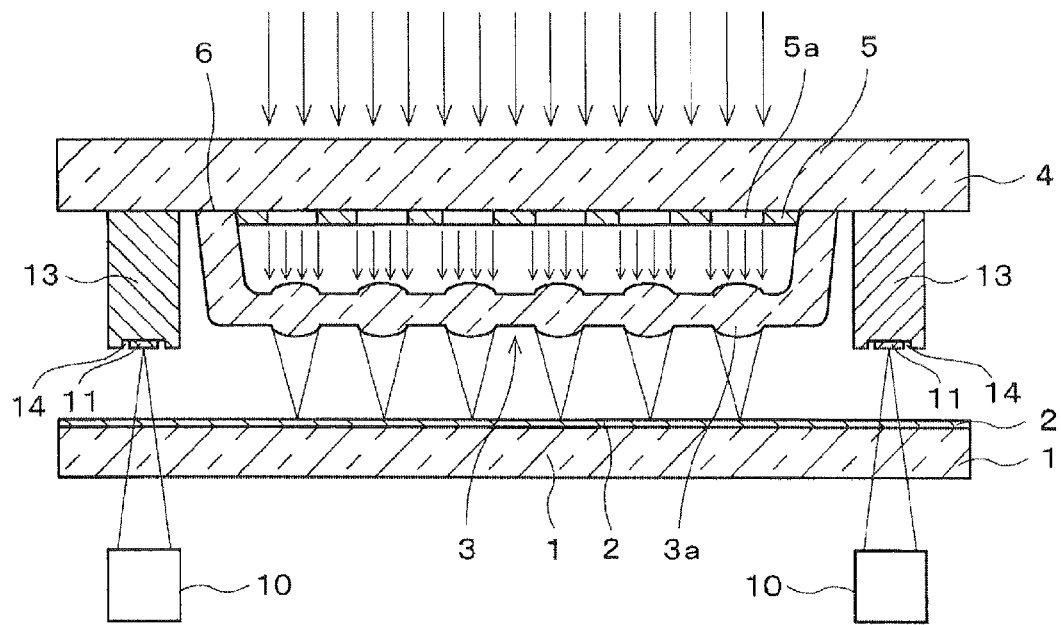
FIG. 2 is a cross-sectional view showing an exposure apparatus according to another embodiment of the present invention.

Next, another embodiment of the present invention will be described with reference to FIG. 2. In this embodiment, concave parts 14 are formed in the bottom surfaces, i.e., surfaces that face the substrate 1 in alignment mark supports 13 provided to the bottom surface of the mask 4, and the alignment marks 11 are formed in the surfaces in the concave parts 14 that face the substrate 1. The alignment mark supports 13 are formed so that the gaps between the substrate 1 and the surfaces of the peripheries of the concave parts 14 are smaller than the gaps between the substrate 1 and the microlens arrays 3.

In the exposure apparatus configured in this manner, when there is any abnormality in the gaps between the microlens arrays 3 and the substrate 1, the distal end surfaces of the alignment mark supports 13 come in contact with the substrate 1, and when impurities have gotten on the substrate 1, the distal end surfaces of the alignment mark supports 13 come in contact with the impurities. Therefore, the alignment marks 11 do not come in contact with the substrate 1 or the impurities, and the alignment marks 11 are therefore not scratched. Consequently, in the present embodiment, the running cost can be further reduced because not only can the microlens arrays 3 be used continuously, but the alignment marks 11 can be used continuously as well. The alignment marks 11 are not limited to being formed in concave parts provided to the distal end surfaces of the alignment mark supports 13, and another possible option is to provide steps in the distal end surfaces of the alignment mark supports 13 and form the alignment marks 11 in low positions on these steps, i.e., surfaces nearer to the substrate 1 than the farthest protruding surfaces of the distal end surfaces.

INDUSTRIAL APPLICABILITY

The present invention provides an exposure apparatus using microlens arrays, wherein damage to the microlens arrays caused by impurities can be prevented, and the positions of the substrate and the mask can be easily aligned.

KEY

1: substrate (production substrate)
1a: substrate for adjustment
2: resist film
3: microlens arrays
3a: microlenses
4: mask
5: Cr film
5a: holes
10: cameras
11: alignment marks
12, 13: alignment mark supports
30: supports
31: marks

The invention claimed is:

1. An exposure apparatus using a microlens array, comprising:
   a substrate stage for supporting a transparent substrate to be subjected to exposure;
   a microlens array arranged above the substrate stage and having a plurality of microlenses formed therein;
   a light-blocking mask arranged above the microlens array and fixed to said microlens array, said light-blocking mask facing said transparent substrate;
   an exposure light source;
   an optical device for guiding outgoing exposure light from the exposure light source to said light-blocking mask and using said microlens array to image exposure light transmitted through said light-blocking mask onto the transparent substrate mounted on said substrate stage;
   an alignment mark support arranged in a surface of said mask that faces said transparent substrate;
   an alignment mark formed in a surface of the alignment mark support that faces said transparent substrate; and
   a light radiating unit that radiates light transmitted through said transparent substrate onto said alignment mark for detecting a substrate mark provided to said transparent substrate and said alignment mark within a same field of vision, the light radiating unit being arranged below said transparent substrate,
   wherein a space between said alignment mark support and said transparent substrate is smaller than a space between said microlenses and said transparent substrate.

2. The exposure apparatus using a microlens array according to claim 1, wherein a concave part or a step is formed in the surface of said alignment mark support that faces said transparent substrate, and said alignment mark is formed in a low position in said concave part or step.

3. The exposure apparatus using a microlens array according to claim 2, wherein said microlens array and said transparent substrate are capable of moving relative to each other, and a pair of said alignment marks are formed at both ends of said mask in a direction orthogonal to a movement direction.

4. The exposure apparatus using a microlens array according to claim 1, wherein said microlens array and said transparent substrate are capable of moving relative to each other, and a pair of said alignment marks are formed at both ends of said mask in a direction orthogonal to said movement direction.

5. The exposure apparatus using a microlens array according to claim 1, wherein the light radiating unit comprises a camera.

6. An optical member, comprising:
   a microlens array for imaging exposure light on a substrate to be subjected to exposure and exposing the substrate;
   a light-blocking mask fixed to the microlens array so as to be parallel to said microlens array;
   an alignment mark support arranged farther outside than said microlens array in a surface of the mask on a side where said microlens array is arranged; and
   an alignment mark formed in a distal end surface of the alignment mark support,
   wherein a distance between the distal end surface of said alignment mark support and said mask is greater than a distance between the distal end surface of said microlens array and said mask.

7. The optical member using a microlens array according to claim 6, wherein a concave part or a step is formed in the distal end surface of said alignment mark support, and said alignment mark is formed in a low position in said concave part or step.

* * * * *